United States Patent [19]

Nishizawa et al.

[11] 4,450,466
[45] May 22, 1984

[54] SEMICONDUCTOR IMAGE SENSOR

[75] Inventors: Jun-ichi Nishizawa; Tadahiro Ohmi, both of Sendai; Seiji Matsumoto, Minami-ashigara, all of Japan

[73] Assignee: Fuji Photo Film Co., Ltd., Japan

[21] Appl. No.: 326,883

[22] Filed: Dec. 2, 1981

[30] Foreign Application Priority Data

Dec. 5, 1980 [JP] Japan ............................ 55-171898

[51] Int. Cl.³ .................... H01L 27/14; H01L 29/78; H01L 27/12; H01L 27/04
[52] U.S. Cl. .......................... 357/30; 357/23; 357/49; 357/50
[58] Field of Search ............... 357/30 H, 1, 22 LS, 357/23 CS, 23 C, 23 R, 31, 47, 41, 49, 50

[56] References Cited

U.S. PATENT DOCUMENTS

| 4,106,050 | 8/1978 | Riseman | 357/49 |
| 4,199,771 | 4/1980 | Nishizawa et al. | 357/22 |
| 4,377,817 | 3/1983 | Nishizawa et al. | 357/30 X |

OTHER PUBLICATIONS

Nishizawa et al., "Static Induction Transistor Image Sensors", *IEEE Trans. on Electron Dev.*, vol. ED-26, No. 12, pp. 1970-1977, Dec. 1979.

*Primary Examiner*—Martin H. Edlow
*Assistant Examiner*—J. L. Badgett
*Attorney, Agent, or Firm*—McGlew and Tuttle

[57] ABSTRACT

A semiconductor image sensor which comprises a plurality of image sensor cells, each having a photosensing and accumulation region of an $n^+-p^--(i)-p^+-n^+$ (or $p^+-n^--(i)-n^+-p^+$) hook structure which is formed by sequentially forming its respective regions in a semiconductor substrate inwardly thereof from its surface. The photosensing and accumulation regions are isolated by insulating isolation regions from adjacent ones of them. A tapering conductive region, which acts as an electric field lens on charged carriers, is formed to extend into a high resistivity layer of the photosensing region from the end face of each insulating isolation region on the side of the semiconductor substrate.

3 Claims, 11 Drawing Figures

SEMICONDUCTOR IMAGE SENSOR

BACKGROUND OF THE INVENTION

1. Field of the Invention

The present invention relates to a semiconductor image sensor, and more particularly to a semiconductor image sensor which is provided with a photosensing and accumulation region of a hook structure.

2. Description of the Prior Art

Semiconductor image sensors that have heretofore been employed are mostly the MOS type and the CCD type. The MOS type image sensor permits simple peripheral circuit arrangements and allows ease in incorporating peripheral circuits and a scanning circuit into the sensor body but, on the other hand, it has the disadvantages of large switching noise and an excessive video line capacitance which leads to lowered sensitivity when it fabricated for multibit operations. In contrast thereto, the CCD type image sensor has high sensitivity and hence can be used at low light levels and, in terms of its arrangement, permits fabrication for multibit operations; in practice, however, when it is constructed for multibit operations, its drive circuit becomes complicated and complexity is introduced in its manufacturing process and, in addition, a high degree of stability is needed in operation.

Recently a novel image sensor which is free from such defects has been proposed by the present inventors. Which image sensor will hereinafter be referred to as the prior art image sensor. The prior art image sensor achieves (1) wide dynamic range, (2) high sensitivity, (3) low noise and (4) high image clarity by the provision of a photosensing and accumulation region of a hook structure. One of its striking features is non-destructive readout of optical information by a carrier storage effect which is characteristic of the hook structure.

In the photosensing and accumulation portion of an example of the abovesaid image sensor, there is formed a hook structure which comprises a low resistivity first region of a first conductivity type, a high resistivity second region, a low resistivity third region of a second conductivity type reverse from the first one and a low resistivity fourth region of the first conductivity which are sequentially formed one on another in a semiconductor substrate inwardly thereof from its surface; namely, a hook structure is constituted by, for example, an n+ region, a p− region, a p+ region and an n+ region. Of these regions, only the p+ and n+ regions on the side of the substrate are isolated by an insulating isolation region in a lateral direction to form a plurality of cells, thereby defining a pn junction. That is, the n+ and p− regions on the side of the surface of the substrate assembly are common to the cells. A transparent electrode is formed on the outer n+ region and, on the other hand, a readout transistor is connected to the inner n+ region. The substrate is irradiated by light through the transparent electrode which is supplied with a positive voltage.

Electrons of electron-hole pairs which are created by the optical irradiation in the vicinity of the substrate surface, are immediately absorbed by the transparent electrode supplied with the positive voltage but holes are accelerated by the electric field to flow across the p− region into the inner p+ region. Between the p+ region and the inner n+ region is formed a pn junction having a predetermined barrier voltage. The barrier prevents the holes having flowed into the p+ region further flow into the inner n+ region. In consequence, the holes are accumulated in a potential well of the hook structure formed in this p+ region. As the accumulation of the holes proceeds, the barrier voltage of the pn junction drops, resulting in flowing out of electrons from the inner n+ region towards the p− region across the pn junction. The electrons are accelerated to flow through the p− region and the outer n+ region and absorbed into the transparent electrode supplied with the positive voltage. As a result of this, the floating inner n+ region from which the electrons have flowed out is charged positive to raise its potential. The increased potential of this n+ region is read out by the aforesaid readout transistor.

The prior art image sensor possesses the above-described many advantages over the conventional MOS type and CCD type image sensors but has some problems to be solved for enhancement of light receiving sensitivity, operation speed and so forth.

SUMMARY OF THE INVENTION

It is therefore an object of the present invention to improve the light receiving sensitivity of the prior art image sensor.

Another object of the present invention is to increase the operation speed of the prior art image sensor.

Another object of the prior art is to enhance resolution by reducing crosstalk between adjacent cells.

Yet another object of the present invention is to reduce noise without lowering sensitivity.

The abovesaid objective can be achieved by providing a semiconductor image sensor which comprises a low resistivity first region of a first conductivity type, a high resistivity second region, a low resistivity third region of a second conductivity type, a low resistivity fourth region of the first conductivity type, the first to fourth regions being sequentially formed one on another in a single semiconductor substrate inwardly thereof from its surface, an insulating isolation region for isolating the third and fourth regions in a lateral direction, a fifth region vertically extending into the second region from that portion of the insulating isolation region facing towards the first region, electrode means disposed in contact with the first region, and readout means connected to the fourth region.

DESCRIPTION OF THE PREFERRED EMBODIMENTS

Figure 1A:
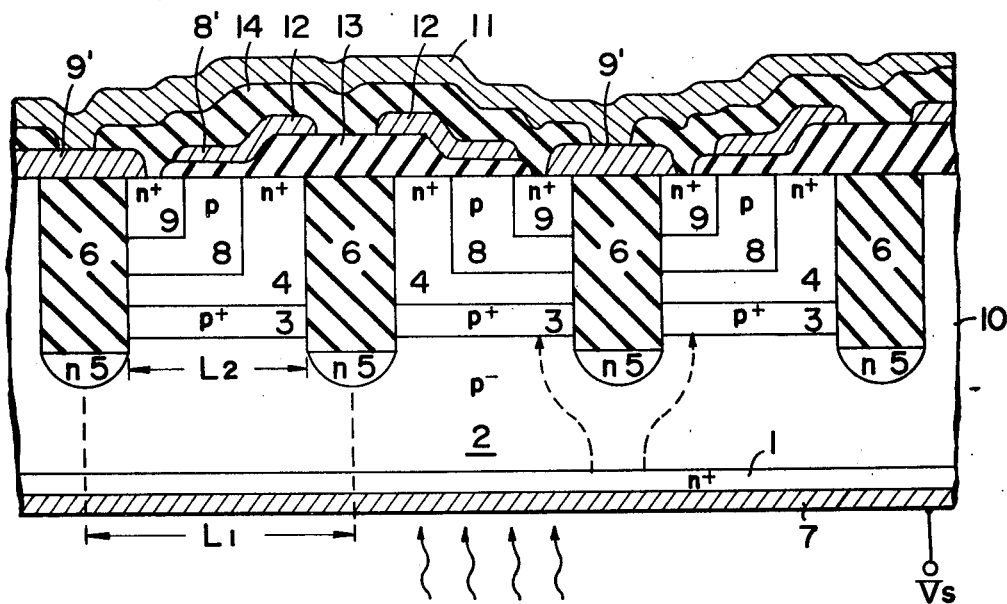
FIGS. 1(a) and 1(b) are respectively a longitudinal sectional view and a cross sectional view illustrating a preferred embodiment of the present invention.
Figure 1B:
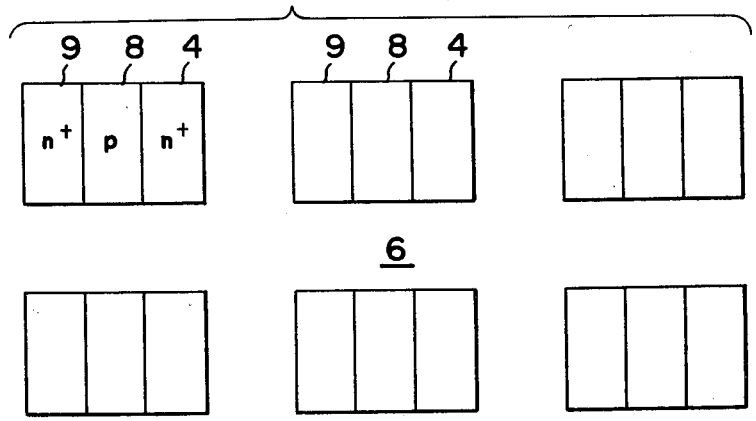

FIG. 1 illustrates in section an embodiment of the present invention, FIG 1(a) being a sectional view parallel to a direction normal to a semiconductor substrate 10 (which direction will hereinafter be referred to as the vertical direction) and FIG. 1(b) a sectional view parallel to a direction tangent to the surface of the substrate 10 (which direction will hereinafter be referred to as the lateral direction). The device of this embodiment has such an image sensor structure that a number of photoelectric conversion cells separated by insulating isolation regions 6 are arranged in a matrix form in the single semiconductor substrate 10 as of silicon. Each cell is composed of a photosensing region and a readout transistor, which are formed one on the other in the vertical direction to provide very compact structure.

The photosensing region of each cell is formed by an $n^+ - p^- - p^+ - n^+$ hook structure composed of an $n^+$ region 1, a $p^-$ region 2, a $p^+$ region 3 and an $n^+$ region 4 and an n region 5 which taperingly projects towards the $n^+$ region 1 from that portion of the insulating isolation region 6 facing the $n^+$ region 1. An electrode 7 formed on the surface of the $n^+$ region 1 is supplied with a positive pulse voltage Vs (a write pulse) of a proper width. The readout transistor is constituted by an $n^+$ drain region 9, a p channel region 8, the $n^+$ source region 4, a drain electrode 9' and a gate electrode 8'. To the drain electrode 9' and the gate electrode 8' are respectively connected a bit line 11 and a word line 12. The bit line 11 is formed of metal such as aluminum, or semiconductor such as doped silicon. The word line 12 is formed of a silicide of high melting point metal such is molybdenum, tungsten, titanium or the like, that is, $MoSi_2$, $WSi_2$, $TiSi_2$ or the like, or semiconductor such as doped silicon. The electrode 7 is a transparent electrode which is formed of a transparent material such as polysilicon, $SnO_2$, $InO_2$ or the like, or a thin metal film. An insulating layer 13 serves as a gate insulating layer and an insulating layer 14 insulates the bit line 11 and the word line 12 from each other.

Figure 2A:
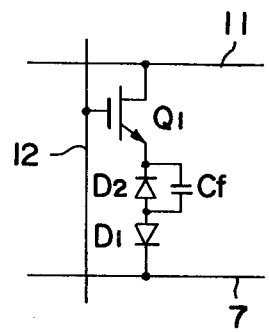
FIG. 2(a) is an equivalent circuit of one cell of the device shown in FIG. 1(a) FIG. 2(b) being like FIG. 2(a) but showing eight cells.
Figure 2B:
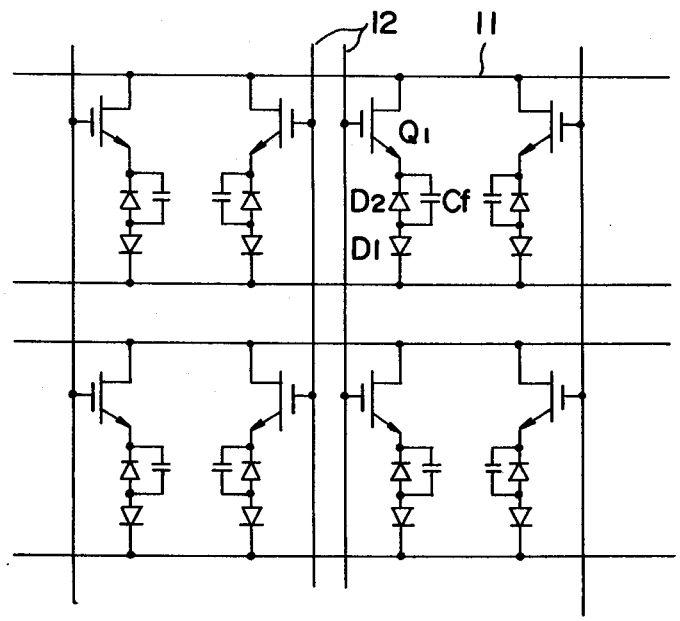

FIG. 2(a) shows an equivalent circuit of a unit cell made up of the photosensing region and the readout transistor as described above. In the photosensing region, the $n^+$ region 1 and the high resistivity $p^-$ and $p^+$ regions 2 and 3 constitute a ($p^+p^-$nt) diode D1 similar to a pin diode and the $p^+$ region 3 and the $n^+$ region 4 form a diode D2. The $p^-$ region 2 may be either an i or $n^-$ region so long as it is a high resistivity region. Since the high resistivity $p^-$ region 2 is sufficiently long in the vertical direction, the junction capacitance of the diode D1 is sufficiently small as compared with the junction capacitance Cf of the diode D2 and a reverse bias resistance of the diode D1; hence it can be omitted from the equivalent circuit. On the other hand, the $n^+$ drain region 9, the p channel region 8 and the $n^+$ source region 4 from an electrostatic induction transistor Q1 for readout use. FIG. 2(b) exemplifies the connection of eight such cells.

In the device of FIG. 1, when applying the positive voltage Vs (a write pulse), the pn junction formed between the n region 5 and the $p^-$ region is forwardly biased, permitting elections to flow out of the n region 5 into the $p^-$ region 2. The electrons are accelerated to flow through the $p^-$ region 2 into the $n^+$ region and thence they are absorbed by the electrode 7. The floating n region 5 from which the electrons have flowed out is charged positive.

Figure 3:
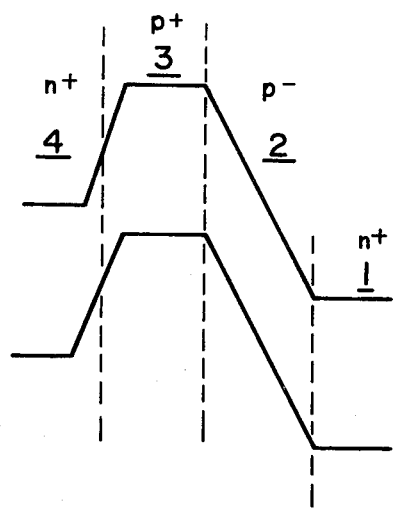
FIG. 3 is an energy diagram of a hook structure in the embodiment of FIG. 1.

FIG. 3 shows an energy diagram of the photosensing region when the positive voltage Vs is applied to the electrode 7. A depletion layer is formed in the high resistivity $p^-$ region 2. This corresponds to reverse biasing of the pin diode (to be exact, a $p^+p^-n^+$ diode) D1 in the equivalent circuit of FIG. 2(a). In a preferred embodiment of the present invention, the thickness of the $p^-$ region 2, the impurity concentration and the value of the voltage Vs are selected so that the $p^-$ region 2 may be depleted throughout it. This is set forth in detail in prior patent application U.S. Ser. Nos. 254,046 and 265,383 and Japanese Patent Application No. 60316/80. In FIG. 3, a pn junction having a fixed barrier voltage is formed between the $p^+$ region 3 and the $n^+$ region 4 but since the positive voltage applied to the electrode 7 is mostly fed to the high resistivity $p^-$ region 2, the forward bias to the pn junction is limited to a very small value.

When the device is illuminated through the transparent electrode 7 from the back of the substrate 10 while the positive voltage is being applied as described above, pair creation of electrons and holes takes place in the $p^-$ region 2 near the $n^+$ region 1. The electrons generated are immediately absorbed into the electrode 7, whereas the holes are accelerated by the electric field to flow across the $p^-$ region 2 into the $p^+$ region 3 wherein they are accumulated. At this time, since the n region 5 is charged positive, the holes travelling near the n region 5 is repelled by it to be deflected towards the central portion of the $p^+$ region 3 as indicated by the broken line in FIG. 1(a). In this way, the holes generated in the peripheral portion of the cell are focused to the central portion of the $p^+$ region 3 through the lens-like action of the n region 5. A detailed description will be given later of the effect by this focusing action.

Now, let it be assumed that the quantum efficiency is 1 in a one-dimensional model. Letting unit charge, the velocity of light, the photon density and the time after the start of illumination be represented by q, C, S(t) (photons/cm$^3$) and t, respectively, the amount of positive charges by holes per unit area which are accumulated in the $p^+$ region 3 is given by $$\Delta Q = C \cdot q \int_0^t S(t) dt.$$

By such accumulation of the holes or the positive charges in the $p^+$ region 3, the barrier voltage of the pn junction between the $p^+$ region 3 and the $n^+$ region 4 drops by $\Delta V = \Delta Q/Cf$. This corresponds to forward biasing of the diode D2 by $\Delta V$ in the equivalent circuit of FIG. 2.

Consequently, electrons in the $n^+$ region 4 flow out therefrom into the $p^-$ region 2 across the $p^+$ region 3. The electrons are accelerated to pass through the $p^-$ region 2 and the $n^+$ region 1, thereafter being absorbed into the electrode 7 supplied with the positive voltage. As a result of this, the $n^+$ region 4 in the floating state is charge positive by the amount of charges of the electrons having flowed out therefrom, causing a gradual increase in the barrier voltage of the pn junction formed between the $n^+$ region 4 and the $p^+$ region 3. This corresponds to gradual cancellation of the forward bias $\Delta V$ of the diode D2 in response to the flowing out of the electrons in the equivalent circuit of FIG. 2(a). Such charging of the $n^+$ region 4 stops when the amount of positive charges in the $n^+$ region 4, which decreases as the electrons flows out therefrom, becomes equal to the amount of charges of the holes accumulated in the $p^+$ region. At this time, the barrier potential becomes equal to a value in the state of thermal equilibrium before the accumulation of the holes and and the potential of the n+ region 14 rises higher by ΔV than that before the hole accumulation.

The voltage of the n+ region 4 thus raised is read out by the readout transistor Q1 on the bit line 11. In other words, the word line 12 in FIG. 1(a) is opened to turn ON the readout transistor Q1, by which electrons flow out of the n+ region 9 into the n+ region 4 across the p region 8, reading out the positive voltage on the bit line 11. The positive charges stored in the n+ region 4 before the readout operation are neutralized by the charges of electrons flowing into the n+ region 4 during the readout and when the readout transistor Q1 is turned OFF, the amount of positive charges in the n+ region 4 becomes small to some extent. This value is dependent upon the amount of charges stored before the readout, the amount of charges accumulated during the readout and combinations of various readout conditions. No matter what the value may be, if the amount of positive charges accumulated in the n+ region 4 is smaller than the amount of positive charges of holes accumulated in the p+ region 3, the barrier voltage drops by the value corresponding to the division of the difference between the amounts of charges in the both regions by the junction Cf and, as a result, electrons flow out of the n+ regions across p+ region 3 into the electrode 7 supplied with the positive voltage. This flowing out of electrons continues until the amount of positive charges in the n+ region 4 becomes equal to the amount of positive charges of holes accumulated in the p+ region 3. In such a device of the present invention, information once destructed (the increased voltage of the n+ region 4) by the readout is automatically regenerated.

In order that such regeneration may be complete, it is desirable, of course, that the holes once accumulated in the p+ region 3 are not extinguished nor do they flow out therefrom, in particular, even if the barrier voltage between the p+ region 3 and the n+ region 4 is low, the holes accumulated in the p+ region 3 do not flow out therefrom into the n+ region 4. In other words, it is desirable that a current crossing the junction during write and during regeneration after readout is occupied by an electron current as much as possible. An ordinary method for the above is common to a method for improving the emitter injection efficiency of a bipolar transistor and some of its specific means are discussed in detail in the aforesaid prior applications.

In the device of the present invention, information once written is not extinguished by readout as described above. For the extinction of the information, the present invention employs such an arrangement that the polarity of the voltage to the electrode 7 is inverted, by which the holes accumulated in the n+ region 3 are absorbed into the electrode 7 across the p− region 2, or electrons are flowed from the electrode 7 into the p+ region 3 across the p− region 2. It is to employ such an arrangement that a transistor for short-circuiting use is built in the substrate 10.

Since the increased voltage ΔV of the n+ region 4 is inversely proportional to the junction capacitance Cf between the regions 3 and 4, it is desirable to minimize the junction capacitance Cf for increasing the readout voltage per quantity of incident light, that is, the light receiving sensitivity. As the junction capacitance decreases, the charge and discharge time constants of the junction also diminish, improving the light recovery sensitivity and permitting high-speed operation. For reducing the junction capacitance Cf, the junction area must be decreased ultimately. The reason is that the measure of lowering the impurity concentration has its limit. As shown in FIG. 1(a), the light receiving area of each cell is proportional to L1 and the junction area is proportional to L2. In conventional devices, if the junction area ($\propto$ L2) is decreased while retaining the quantity of light received per cell or the light receiving area ($\propto$ L1) unchanged, then holes generated in the surface portion corresponding to the difference in area {$\propto$(L1−L2)} collide against the tip of the insulating isolation region 6 and captured by a capture level of an interface, and they hence cannot reach the p+ region 3 or they are delayed in arrival. Further, in the conventional devices, holes created in the vicinity of the boundary between cells flow into adjacent ones of the cells, causing blurring of an image in the neighborhood of the boundary.

In the device of the present invention, since the floating n region 5 is always charged positive, holes travelling near the region 5 is repelled by it to be deflected towards the center of the cell as indicated by the broken line in FIG. 1(a). In other words, an electrical lens is formed by the n region 5.

On account of such an electric field lens effect, it is possible to reduce the area ($\propto$ L2) of the p+ region 3 while retaining the light receiving area ($\propto$ L1) unchanged, for example, by increasing the width of the insulating isolation region 6 in the lateral direction in FIG. 1(a). As a result of this, the junction capacitance Cf can be decreased while holding unchange the amount of light received by each cell. This enables improvement of the light receiving sensitivity and speeding up of operation as well as marked reduction of defocusing of an image which is caused by flowing out of holes from each cell into adjacent ones of them.

Further, the present invention has the following effect: A noise input can be minimized when lowering the bias voltage Vs to hold charges in the floating p+ region 3 and the n+ region 4 after accumulating therein the charges by illuminating the device while applying the bias voltage Vs of such a value that substantially the entire area of the p− region 2 can be depleted. By lowering the bias voltage Vs, its electric field in the vicinity of the accumulation region is diminished to weaken the lens action of the n region 5 and, consequently, there is no action of leading a noise input to the accumulation region. Moreover, carriers of the noise input to the accumulation region are proportional to the area of an entrance, so that the smaller the accumulation region is, the more the noise input when holding the charges decreases.

As described above, the semiconductor image sensor of the present invention which is provided with the n region 5 having the lens action possesses the advantage of reducing noise without impairing sensitivity.

While in the foregoing the present invention has been described as being applied to a semiconductor image sensor having an n+−p−−p+−n+ hook structure, it is also possible, of course, to employ a p+−n−−p+ hook structure in which the respective regions are reverse in polarity from those of the above hook structure. In this case, the polarity of the readout transistor Q1 is inverted. Further, the readout transistor may be a known one.

Figure 4:
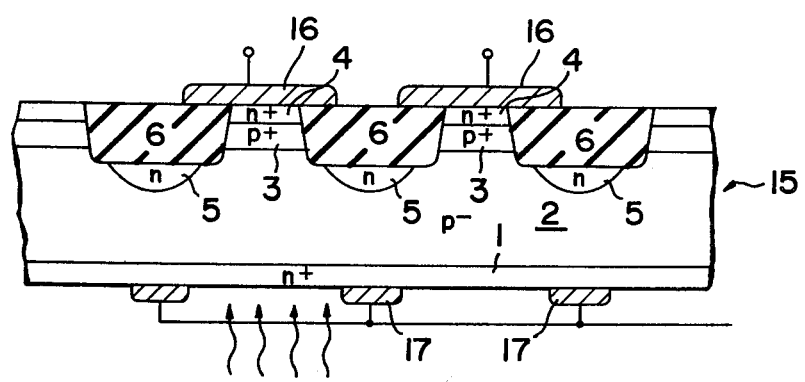
FIG. 4 is a sectional view illustrating another embodiment of the present invention.
Figure 5A:
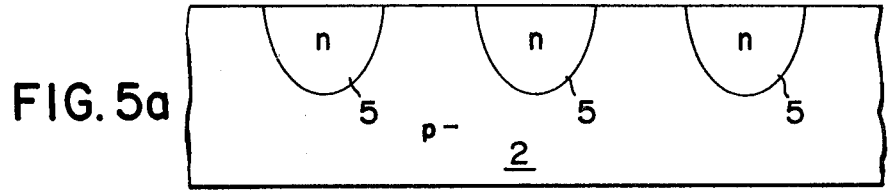
FIGS. 5(a) to 5(e) show, in section, a sequence of steps involved in the manufacture of the device depicted in FIG. 4.
Figure 5B:
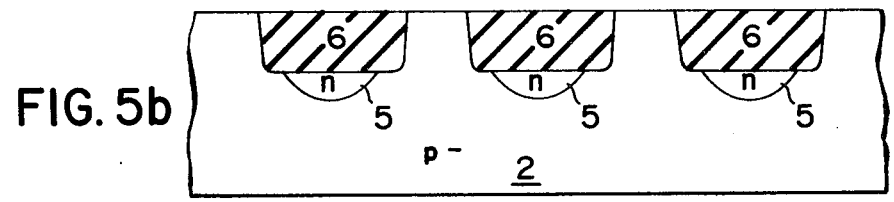
Figure 5C:
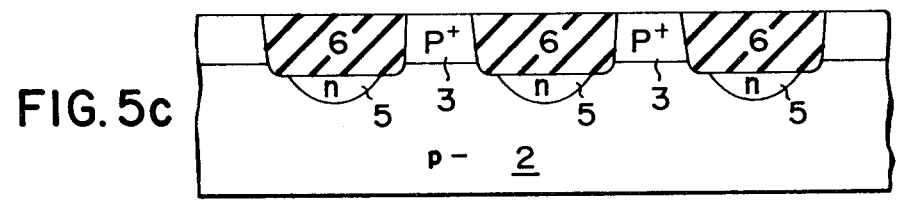
Figure 5D:
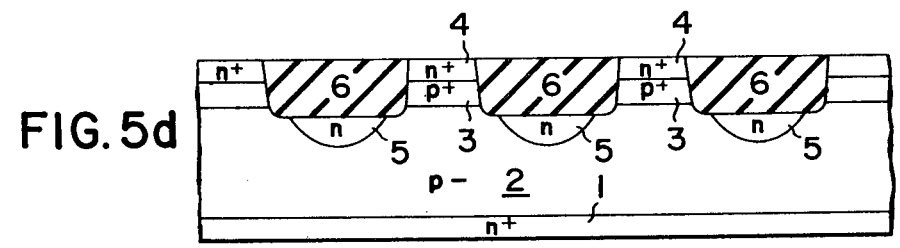
Figure 5E:
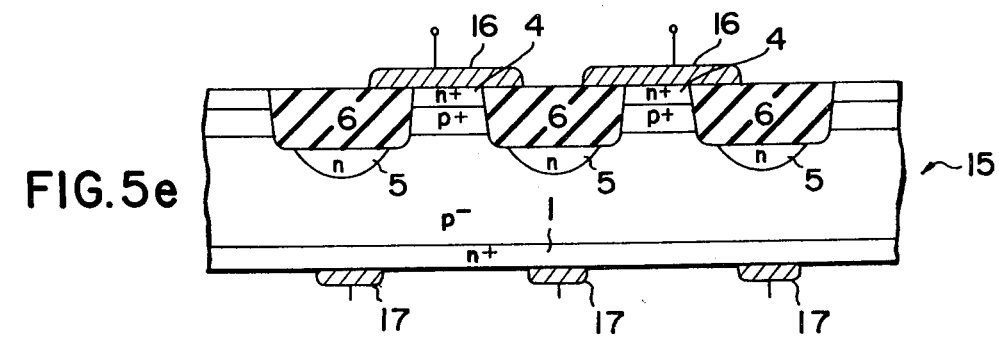

FIG. 4 illustrates in section another embodiment of the present invention, in which the regions identified by the same reference numerals as those in FIG. 1 are the same regions as in FIG. 1. The image sensor of this embodiment differs from the embodiment of FIG. 1 in that each cell is not provided the readout transistor in the same semiconductor substrate but is composed of the photosensing region alone. In addition, discrete small electrodes 17 are deposited on the back of the substrate 10 instead of forming the transparent electrode over the entire area thereof. As the operation of this embodiment is exactly the same as that of the photosensing region of the embodiment shown in FIG. 1, no detailed description will be repeated. The positive voltage induced in the n+ region 4 in proportion to the quantity of light received is read out via an electrode 16.

FIG. 5 illustrates in section a sequence of steps involved in the manufacture of the image sensor depicted in FIG. 4. The manufacture starts with the formation of the n region 5 in a p− silicon substrate 2 by means of selective diffusion or ion implantation thereinto, as shown in FIG. 5(a). Then a portion of the n region 5 is oxidized as by selective oxidation to form the insulating isolation region 6 (FIG. 5(b)). Next, a p type impurity is diffused in large quantities into the silicon substrate to form the p+ region 3 (FIG. 5(c)). Therefore, an n type impurity is diffused in large quantities into the silicon substrate 2 from its both sides to form the n+ regions 1 and 4 (FIG. 5(d)). Finally, the electrodes 16 and 17 are deposited as by evaporation.

The embodiments of FIGS. 1 and 4 are arranged so that holes created by illumination are accumulated in the hook-structured potential well but it is also possible to employ such an arrangement that electrons generated by illumination are accumulated in the hook-structured potential well by inverting all of the conductivity types of the regions 1 to 5 and the polarity of the applied voltage mentioned in the foregoing. In FIGS. 1 and 4, the p− region 2 is required only to be a high resistivity region as referred to previously and its conductivity type is arbitrary.

The readout transistor such as an SIT, FET, JFET or the like may be built in the substrate as shown in FIG. 1, or may be provided outside of the substrate as depicted in FIG. 4.

As has been described in the foregoing, the image sensor of the present invention is equipped with an equivalent electric field lens mechanism capable of decreasing the junction area of the hook structure while retaining the light receiving area unchanged; hence, the device of the present invention possesses the advantages of markedly increased light receiving sensitivity, operation speed and image clarity as well as the effect that noise can be reduced without impairing sensitivity.

It will be apparent that many modifications and variations may be effected without departing from the scope of the novel concepts of this invention.

What is claimed is:

1. A semiconduction image sensor comprising:
   a low resistivity first region of a first conductivity type;
   a high resistivity second region of a selected conductivity type;
   a low resistivity third region of a second conductivity type reverse from the first type;
   a low resistivity fourth region of the first conductivity type, the first to fourth regions being sequentially formed one on another in a semiconductor substrate inwardly thereof from its surface;
   an insulating isolation region extending through the third and fourth regions for isolating at least two portions of the third and fourth regions from each other in a lateral direction;
   a fifth region of a conductivity type reverse from the selected type taperingly extending into the second region in a vertical direction from a portion of the insulating isolation region facing towards the first region and being between the at least two portions of the third and fourth regions;
   an electrode disposed in contact with the fourth region; and
   readout means connected to the fourth region.

2. A semiconductor image sensor according to claim 1 wherein the readout means is a metal electrode deposited on the surface of the fourth region.

3. A semiconductor image sensor according to claim 1 wherein the readout means is one of a static induction transistor and a field effect transistor using the fourth region as one of its source and drain region.

* * * * *